United States Patent
Shen et al.

(10) Patent No.: US 9,123,773 B1
(45) Date of Patent: Sep. 1, 2015

(54) T-SHAPED SINGLE DIFFUSION BARRIER WITH SINGLE MASK APPROACH PROCESS FLOW

(71) Applicant: GLOBALFOUNDRIES Inc., Grand Cayman (KY)

(72) Inventors: HongLiang Shen, Ballston Lake, NY (US); Fangyu Wu, Ballston Lake, NY (US); Haigou Huang, Rexford, NY (US); Xusheng Wu, Ballston Lake, NY (US); Changyong Xiao, Mechanicville, NY (US); Wanxum He, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/461,015

(22) Filed: Aug. 15, 2014

(51) Int. Cl.
| | |
|---|---|
| *H01L 21/76* | (2006.01) |
| *H01L 21/762* | (2006.01) |
| *H01L 21/306* | (2006.01) |
| *H01L 21/308* | (2006.01) |
| *H01L 21/02* | (2006.01) |
| *H01L 21/3065* | (2006.01) |

(52) U.S. Cl.
CPC ...... *H01L 21/76224* (2013.01); *H01L 21/0217* (2013.01); *H01L 21/02115* (2013.01); *H01L 21/02118* (2013.01); *H01L 21/3065* (2013.01); *H01L 21/3081* (2013.01); *H01L 21/30604* (2013.01); *H01L 21/76232* (2013.01)

(58) Field of Classification Search
CPC .................................................. H01L 21/76232
See application file for complete search history.

(56) References Cited

U.S. PATENT DOCUMENTS

| | | | | |
|---|---|---|---|---|
| 6,165,870 A | * | 12/2000 | Shim et al. ............. | 438/424 |
| 6,207,532 B1 | * | 3/2001 | Lin et al. ............. | 438/424 |
| 6,746,936 B1 | * | 6/2004 | Lee ...................... | 438/445 |
| 2003/0030089 A1 | * | 2/2003 | Sumino et al. ....... | 257/298 |

* cited by examiner

*Primary Examiner* — Angel Roman
(74) *Attorney, Agent, or Firm* — Ditthavong & Steiner, P.C.

(57) ABSTRACT

Methods of forming a T-shaped SBD using a single-mask process flow are disclosed. Embodiments include providing a substrate having STI regions; forming a hard mask layer over the substrate and the STI regions, the hard mask having an opening laterally separated from the STI regions; forming a recess in the substrate through the opening, the recess having a first width; forming spacers on sidewalls of the recess, with a gap therebetween; forming a trench in the substrate through the gap, the trench having a second width less than the first; removing the spacers; removing the hard mask layer; filling the trench and the recess with an oxide layer, forming a T-shaped STI region; forming another hard mask layer on a portion of the T-shaped STI region; and revealing a Fin by removing portions of the STI regions and the T-shaped STI region.

20 Claims, 6 Drawing Sheets

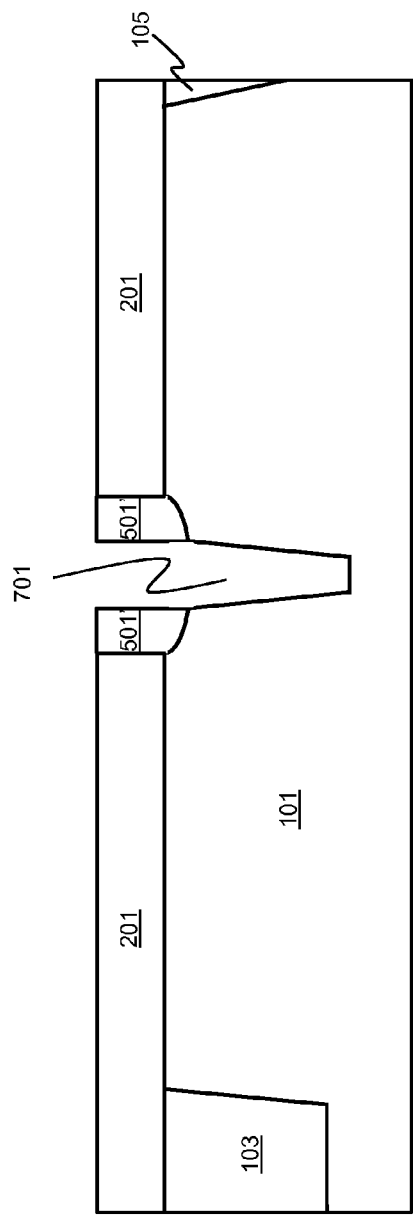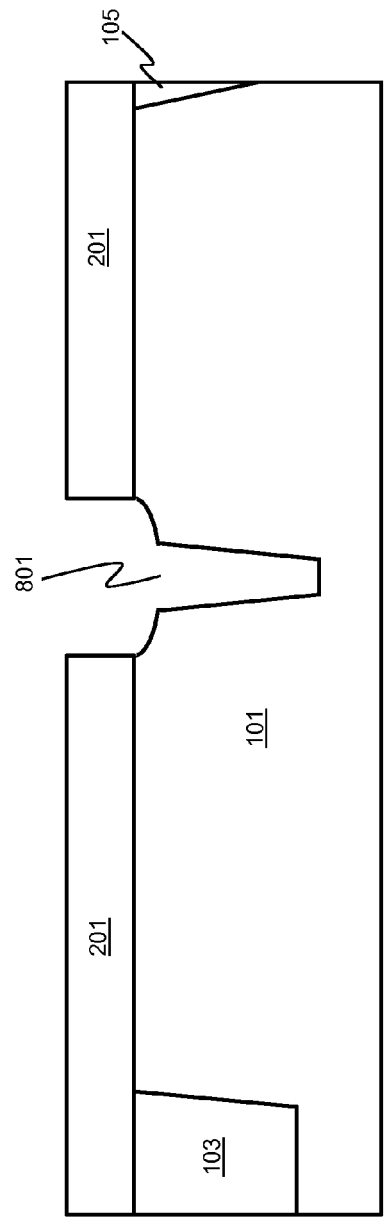

T-SHAPED SINGLE DIFFUSION BARRIER WITH SINGLE MASK APPROACH PROCESS FLOW

TECHNICAL FIELD

The present disclosure relates to an isolation structure formation for fin-type field effect transistor (FinFET) devices. The present disclosure is particularly applicable to the formation of a T-shaped single diffusion break (SDB).

BACKGROUND

Use of an SDB is a key design strategy to reduce the circuit area to enable high-density integrated circuits. In current SDB designs, the shallow trench isolation (STI) layer is a standard shape and at the same height with other structure locations. However, since the dummy gate will be on this STI between two fins, the leakage path or weak point will be a source of potential defects. Moreover, with the current T-shaped SDB process flow, one mask is used to generate a higher oxide STI under the SDB and an additional mask and additional oxide deposition/etch process steps are used to form the SDB. The requirement of two masks, or reticles, makes the current process flow costly.

A need therefore exists for methodology enabling formation of a T-shaped SDB using a single-mask process flow.

SUMMARY

An aspect of the present disclosure is a method of forming a T-shaped SBD using a single-mask process flow.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a silicon substrate having a first and a second STI region; forming a first hard mask layer over the silicon substrate and the first and the second STI region, the hard mask having an opening laterally separated from the first and the second STI region; forming a recess in the silicon substrate through the opening, the recess having a first width; forming spacers on sidewalls of the recess, with a gap therebetween; forming a trench in the silicon substrate through the gap, the trench having a second width less than the first width; removing the spacers; removing the first hard mask layer; filling the trench and the recess with an oxide layer, forming a T-shaped third STI region; forming a second hard mask layer on a portion of the third STI region; and revealing a Fin by removing a portion of the first and second STI region and a portion of the third STI region.

Aspects of the present disclosure include forming the first and the second STI region and the oxide layer of an enhanced high aspect ratio process (eHARP) oxide. Further aspects include forming the hard mask layer of an amorphous carbon (a-C), an organic dielectric layer (ODL), or silicon nitride (SiN). Another aspect includes forming the opening with a width of 50 nanometers (nm) to 150 nm. Additional aspects include forming the recess by etching the silicon substrate to a depth of 5 nm to 30 nm. Other aspects include forming the spacers by forming a spacer layer over the first hard mask, in the opening, and in the recess and removing all horizontal portions of the spacer layer. Further aspects include forming the spacer layer to a thickness of 200 angstroms (Å) to 400 Å. Another aspect includes forming the spacer layer of an oxide or a polymer. Additional aspects include removing the spacer layer by etching or wet cleaning. Other aspects include forming the trench in the silicon substrate by etching the silicon substrate to a depth of 500 Å to 1,500 Å. Further aspects include forming the trench and removing the spacers at the same time by etching with an identical selectivity between Si and oxide. Another aspect includes forming the opening in the first hard mask layer with a reticle and forming the second hard mask layer with the same reticle, but with a negative tone developer (NTD). Additional aspects include removing the portion of the first and the STI region by etching the first and the second STI region to a depth of 20 nm to 50 nm. Other aspects include removing the portion of the third STI region by etching down to a width of 20 nm to 60 nm. Further aspects include revealing the Fin by etching the portion of the first, second and third STI regions by dry etch, chemical oxide removal (COR), reactive ion etching (RIE)+COR, or a silicon cobalt nitride (SiCoNi) step.

Another aspect of the present disclosure is a method including: providing a silicon substrate having a first and a second STI region, the first and the second STI region filled by eHARP oxide; forming a first hard mask layer over the silicon substrate and the first and the second STI region, the hard mark having an opening with a width of 50 nm to 150 nm, the opening laterally separated from the first and the second STI region; forming a recess with a depth of 5 nm to 30 nm in the silicon substrate through the opening, the recess having a first width; forming a spacer layer over the first hard mask and the recess; forming a first trench in the spacer layer down to the silicon substrate, the first trench formed between opposite edges of the opening; forming a second trench in the silicon substrate to a depth of 500 Å to 1,500 Å through the first trench; removing the spacer layer by etching or wet clean; removing the first hard mask layer; filling the third trench and the recess with eHARP, forming a T-shaped third STI region; forming a second hard mask layer on a portion of the T-shaped third STI region, and revealing a Fin by removing a portion of the first and the second STI region and a portion of the third STI region by dry etch, COR, RIE plus COR, or a SiCoNi step.

Aspects of the present disclosure include forming the opening in the first hard mask layer with a reticle and forming the second hard mask layer with the same reticle, but with a NTD. Other aspects include removing the portion of the first and the second STI region by etching the first and the second STI region to a depth of 20 nm to 50 nm. Further aspects include removing the portion of the third STI region by etching down to a width of 20 nm to 60 nm.

A further aspect of the present disclosure is a method including: providing a silicon substrate having a first and a second STI region, the first and the second STI region filled by an eHARP oxide; forming a first hard mask layer over the silicon substrate and the first and the second STI region, the hard mark having an opening with a width of 50 nm to 150 nm, laterally separated from the first and the second STI region, and formed with a reticle; forming a recess with a depth of 5 nm to 30 nm in the silicon substrate through the opening, the recess having a first width; forming spacers of oxide or polymer on sidewalls of the recess, with a gap therebetween; etching a tapered trench with a depth of 500 Å to 1,500 Å in the silicon substrate through the gap, a bottom of the tapered trench having a second width less than the first; removing the spacers by etching or wet clean; removing the first hard mask layer; forming an oxide layer of eHARP over the first and the second STI region and in the tapered trench; planarizing the oxide layer down to the silicon substrate leaving a T-shaped SDB; forming a second hard mask layer on a portion of the T-shaped SDB, the second hard mask layer being formed with the reticle, but with a NTD; revealing a Fin by etching 20 nm to 50 nm of the first and the second STI region and a portion of the T-shaped SBD down to a width of 20 nm to 60 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 12 schematically illustrate a method of forming a T-shaped SBD using a single-mask process flow, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of defects at a leakage path or weak point and cost associated with an additional mask and added deposition and etch steps attendant upon forming a T-shaped SDB.

Methodology in accordance with embodiments of the present disclosure includes providing a silicon substrate having a first and a second STI region. A first hard mask layer is formed over the silicon substrate and the first and the second STI region, the hard mask having an opening laterally separated from the first and the second STI region. A recess is formed in the silicon substrate through the opening, the recess having a first width. Spacers are formed on sidewalls of the recess, with a gap therebetween and a trench is formed in the silicon substrate through the gap, the trench having a second width less than the first width. The spacers are removed. The first hard mask layer is removed and the trench and the recess are filled with an oxide layer, forming a T-shaped third STI region. A second hard mask layer is formed on a portion of the second STI region and a Fin is revealed by removing a portion of the first and the second STI region and a portion of the third STI region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
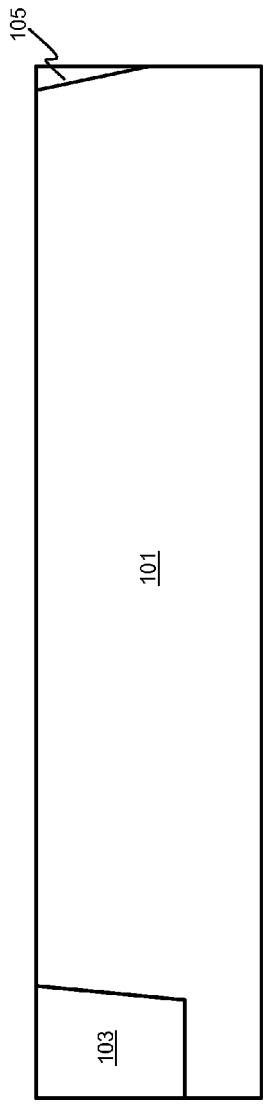
Figure 2:
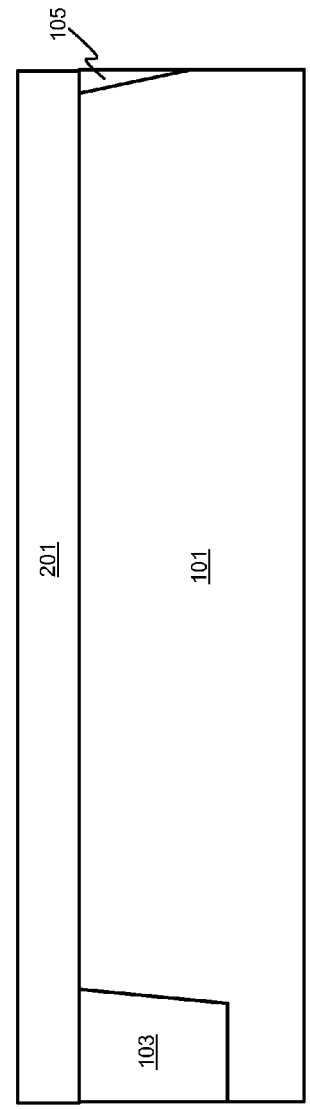
Figure 3:
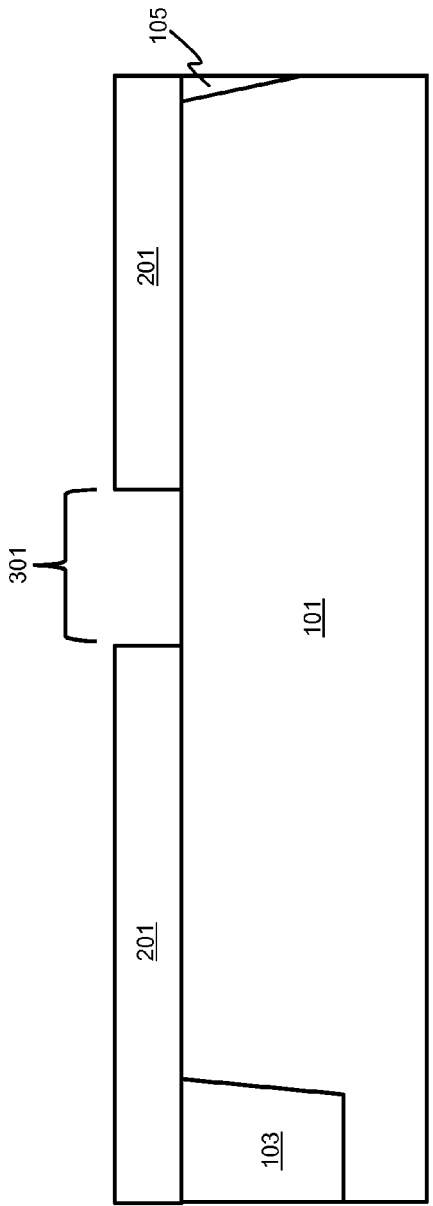
Figure 4:
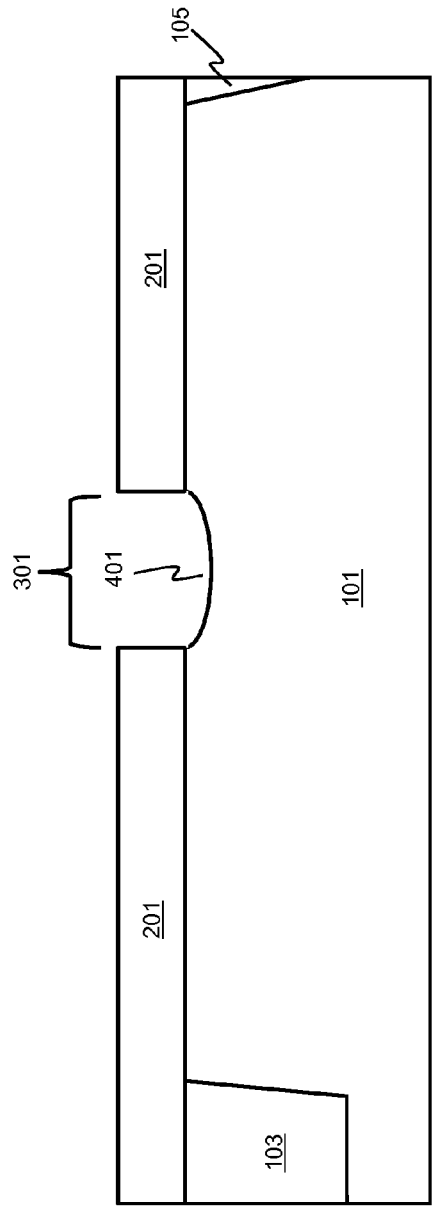
Figure 5:
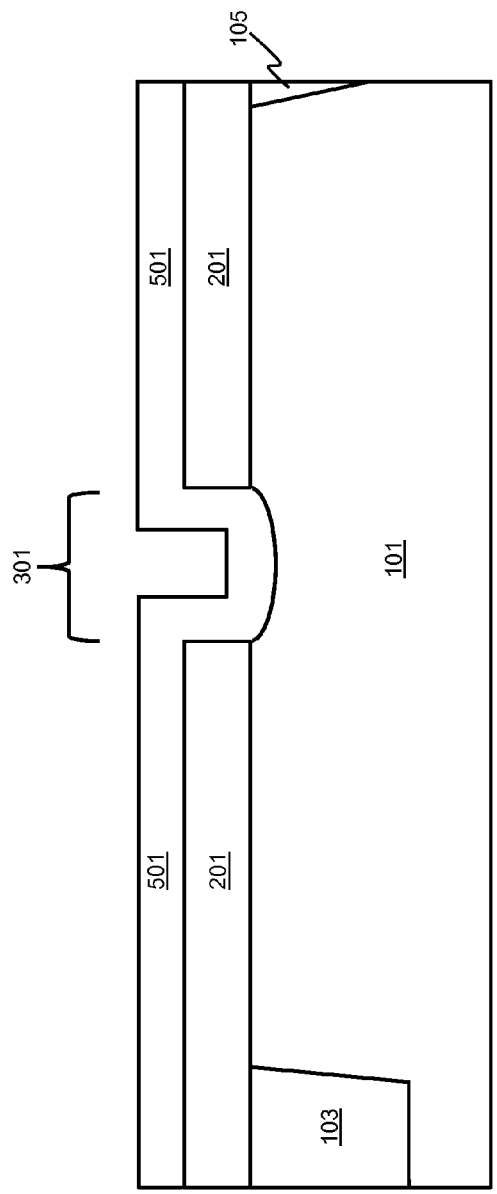
Figure 6:
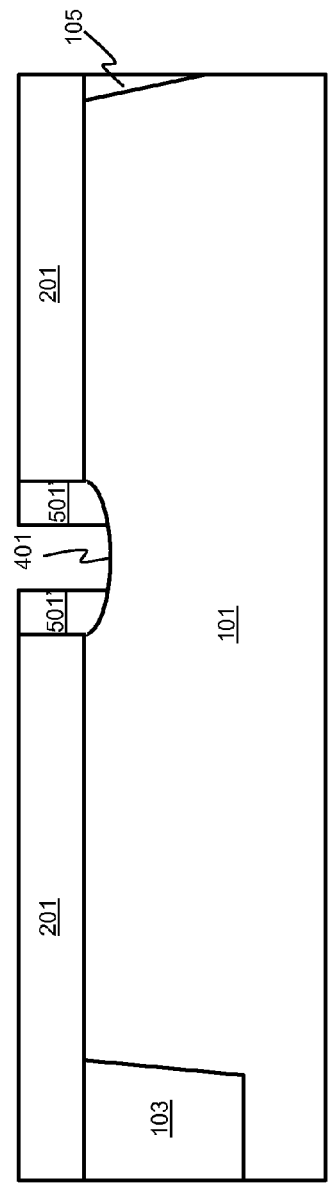

Adverting to FIG. 1, a silicon substrate 101 is provided with STI regions 103 and 105. The STI regions 103 and 105 may be filled, for example, by eHARP. The wafer is buffed, for example, by chemical mechanical polishing (CMP), to planarize the surface. A hard mask layer 201 is then formed, for example, of a-C, ODL, or SiN, over the silicon substrate 101 and the STI regions 103 and 105, as depicted in FIG. 2. An opening 301 may be etched, for example, to a width of 50 nm to 150 nm, in the hard mask layer 201, the opening 301 being laterally separated from the STI regions 103 and 105, as depicted in FIG. 3. In particular, the opening 301 is formed with a reticle (not shown for illustrative convenience). Next, a recess 401 may be formed, for example, by etching the silicon substrate 101 through the opening 301 to a depth of 5 nm to 30 nm. Thereafter, a spacer layer 501 is formed, for example, of an oxide or a polymer, over the hard mask layer 201 and in the opening 301, as depicted in FIG. 5. The spacer layer 501 may, for example, be formed to a thickness of 200 Å to 400 Å. The horizontal portions of the spacer layer 501 are then removed, for example, by etching, forming spacers 501' in the recess 401, as depicted in FIG. 6.

Figure 9:
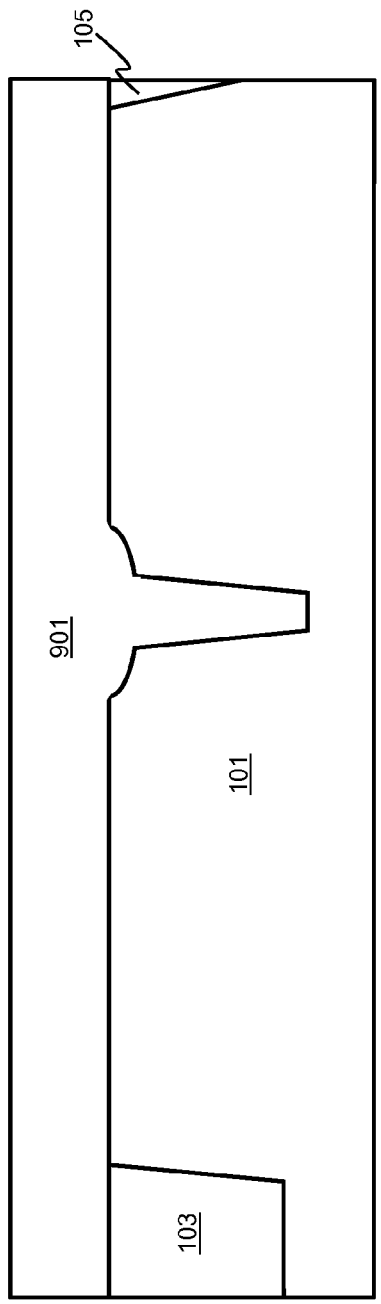
Figure 10:
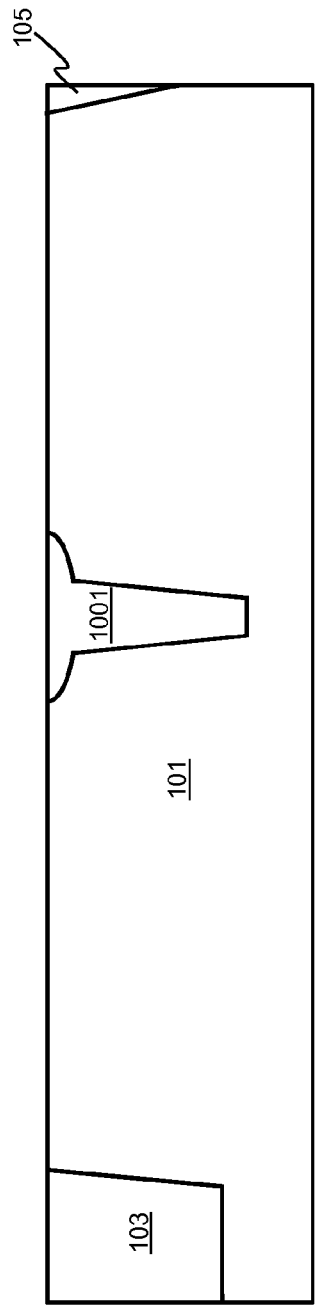

Adverting to FIG. 7, a trench 701 having tapered sidewalls is formed, for example, by etching the silicon substrate 101 through the recess 401. Although shown as separate steps, the formation of spacers 501' and trench 701 may be performed as a single etch step. The trench 701 may, for example, be formed to a depth of 500 Å to 1,500 Å. Next, the spacers 501' are removed, for example, by etching or wet cleaning, e.g., with hydrofluoric acid (HF), as depicted in FIG. 8, forming a T-shaped trench 801. The hard mask layer 201 is then removed and an oxide layer 901, e.g., eHARP, is deposited over the STI regions 103 and 105, the silicon substrate 101, and in the T-shaped trench 801, as depicted in FIG. 9. Next, the oxide layer 901 is planarized, for example, by CMP, leaving a T-shaped SDB 1001 in substrate 101, as depicted in FIG. 10.

Figure 11:
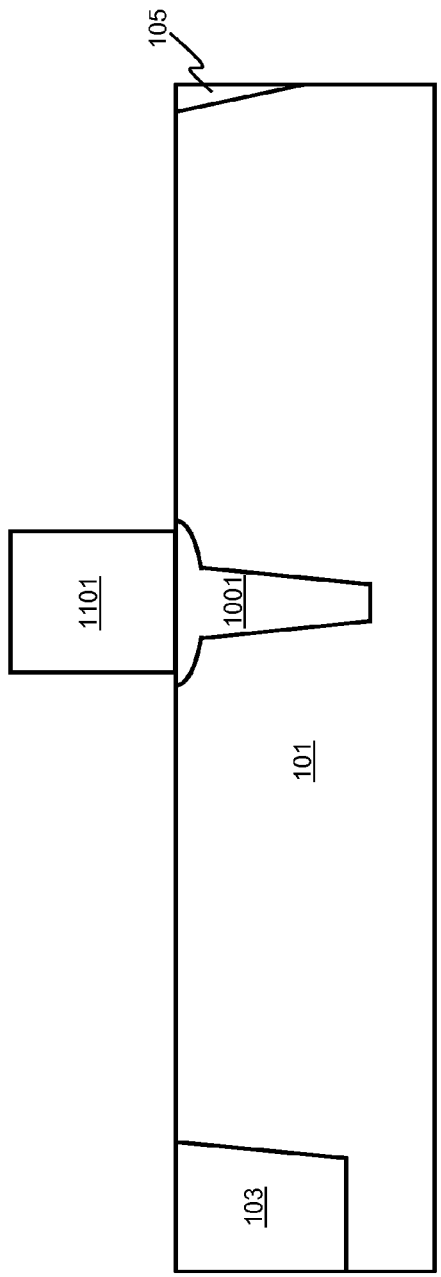
Figure 12:
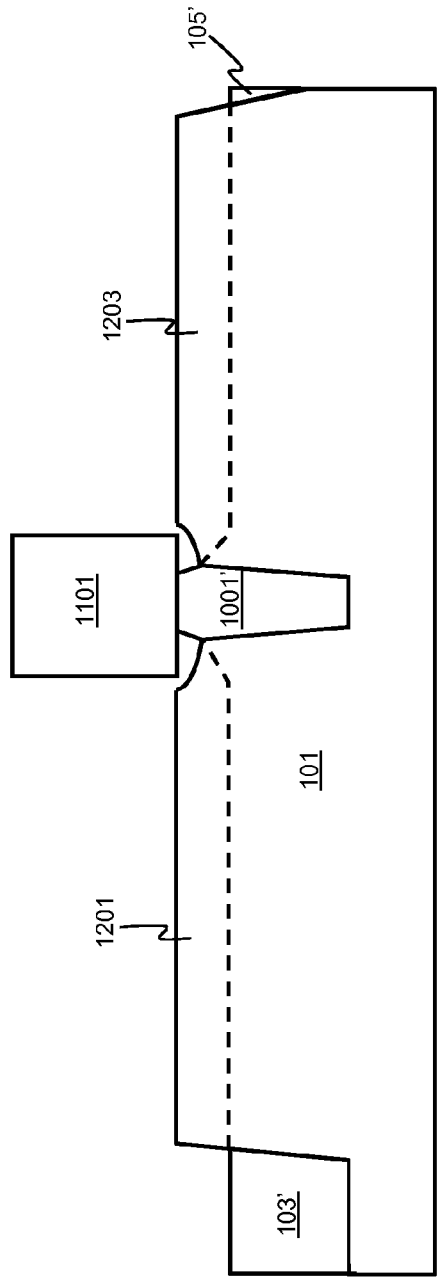

Adverting to FIG. 11, a hard mask layer 1101, e.g., of SiN, is formed on a portion of the T-shaped SDB 1001 using the same reticle that was used to form the opening 301 in FIG. 3. However, in FIG. 11, the reticle is used with a NTD. Next, the fins 1201 and 1203 are revealed, for example, by etching the STI regions 103 and 105 and a portion of the SDB 1001, forming STI regions 103' and 105' and the SDB 1001', as depicted in FIG. 12. The STI regions 103 and 105 may, for example, be etched to a depth of 20 nm to 50 nm. Likewise, the T-shaped SDB 1001 may, for example, be etched on both sides down to a top width of 20 nm to 60 nm. The STI regions 103 and 105 and the SDB 1001 may, for example, be etched by COR, RIE plus COR or a SiCoNi step.

The embodiments of the present disclosure can achieve several technical effects including cost reduction resulting from using one reticle as opposed to two for forming a T-shaped SDB. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a silicon substrate having a first and a second shallow trench isolation (STI) region;
   forming a first hard mask layer over the silicon substrate and the first and the second STI region, the hard mask having an opening laterally separated from the first and the second STI region;
   forming a recess in the silicon substrate through the opening, the recess having a first width;
   forming spacers on sidewalls of the recess, with a gap therebetween;
   forming a trench in the silicon substrate through the gap, the trench having a second width less than the first width;
   removing the spacers;
   removing the first hard mask layer;
   filling the trench and the recess with an oxide layer, forming a T-shaped third STI region;
   forming a second hard mask layer on a portion of the third STI region; and
   revealing a Fin by removing a portion of the first and the second STI region and a portion of the third STI region.

2. The method according to claim 1, comprising forming the first and the second STI region and the oxide layer of an enhanced high aspect ratio process (eHARP) oxide.

3. The method according to claim 1, comprising forming the hard mask layer of an amorphous carbon (a-C), an organic dielectric layer (ODL), or silicon nitride (SiN).

4. The method according to claim 1, comprising forming the opening with a width of 50 nanometers (nm) to 150 nm.

5. The method according to claim 1, comprising forming the recess by etching the silicon substrate to a depth of 5 nm to 30 nm.

6. The method according to claim 1, comprising forming the spacers by forming a spacer layer over the first hard mask, in the opening, and in the recess and removing all horizontal portions of the spacer layer.

7. The method according to claim 6, comprising forming the spacer layer to a thickness of 200 angstroms (Å) to 400 Å.

8. The method according to claim 7, comprising forming the spacer layer of an oxide or a polymer.

9. The method according to claim 6, comprising removing the spacer layer by etching or wet cleaning.

10. The method according to claim 1, comprising forming the trench in the silicon substrate by etching the silicon substrate to a depth of 500 Å to 1,500 Å.

11. The method according to claim 1, comprising forming the trench and removing the spacers at the same time by etching with an identical selectivity between Si and Oxide.

12. The method according to claim 1, comprising forming the opening in the first hard mask layer with a reticle and forming the second hard mask layer with the same reticle, but with a negative tone developer (NTD).

13. The method according to claim 1, comprising removing the portion of the first and the second STI region by etching the first and the second STI region to a depth of 20 nm to 50 nm.

14. The method according to claim 1, comprising removing the portion of the third STI region by etching down to a width of 20 nm to 60 nm.

15. The method according to claim 1, comprising revealing the Fin by etching the portion of the first, second and third STI regions by dry etch, chemical oxide removal (COR), reactive ion etching (RIE)+COR, or a silicon cobalt nitride (SiCoNi) step.

16. A method comprising:
    providing a silicon substrate having a first and a second shallow trench isolation (STI) region, the first and the second STI region filled by an enhanced high aspect ratio process (eHARP) oxide;
    forming a first hard mask layer over the silicon substrate and the first and the second STI region, the hard mark having an opening with a width of 50 nm (nanometer) to 150 nm, the opening laterally separated from the first and the second STI region;
    forming a recess with a depth of 5 nm to 30 nm in the silicon substrate through the opening, the recess having a first width;
    forming a spacer layer over the first hard mask and the recess;
    forming a first trench in the spacer layer down to the silicon substrate, the first trench formed between opposite edges of the opening;
    forming a second trench in the silicon substrate to a depth of 500 angstroms (Å) to 1,500 Å through the first trench;
    removing the spacer layer by etching or wet clean;
    removing the first hard mask layer;
    filling the third trench and the recess with eHARP, forming a T-shaped third STI region;
    forming a second hard mask layer on a portion of the T-shaped third STI region, and revealing a Fin by removing a portion of the first and the second STI region and a portion of the third STI region by dry etch, chemical oxide removal (COR), reactive ion etching (RIE)+COR, or a silicon cobalt nitride (SiCoNi) step.

17. The method according to claim 16, comprising forming the opening in the first hard mask layer with a reticle and forming the second hard mask layer with the same reticle, but with a negative tone developer (NTD).

18. The method according to claim 16, comprising removing the portion of the first and the second STI region by etching the first and the second STI region to a depth of 20 nm to 50 nm.

19. The method according to claim 16, comprising removing the portion of the third STI region by etching down to a width of 20 nm to 60 nm.

20. A method comprising:
    providing a silicon substrate having a first and a second shallow trench isolation (STI) region, the first and the second STI region formed of an enhanced high aspect ratio process (eHARP) oxide;
    forming a first hard mask layer over the silicon substrate and the first and the second STI region, the hard mark having an opening with a width of 50 (nanometer) nm to 150 nm, laterally separated from the first and the second STI region, and formed with a reticle;
    forming a recess with a depth of 5 nm to 30 nm in the silicon substrate through the opening, the recess having a first width;

forming spacers of oxide or polymer on sidewalls of the recess, with a gap therebetween;

etching a tapered trench with a depth of 500 angstroms (Å) to 1,500 Å in the silicon substrate through the gap, a bottom of the tapered trench having a second width less than the first;

removing the spacers by etching or wet clean;

removing the first hard mask layer;

forming an oxide layer of eHARP over the first and the second STI region and in the tapered trench;

planarizing the oxide layer down to the silicon substrate leaving a T-shaped single diffusion break (SDB);

forming a second hard mask layer on a portion of the T-shaped SDB, the second hard mask layer being formed with the reticle, but with a negative tone developer (NTD);

revealing a Fin by etching 20 nm to 50 nm of the first and the second STI region and a portion of the T-shaped SBD down to a width of 20 nm to 60 nm.

* * * * *

UNITED STATES PATENT AND TRADEMARK OFFICE
CERTIFICATE OF CORRECTION

| | | |
|---|---|---|
| PATENT NO. | : 9,123,773 B1 | Page 1 of 1 |
| APPLICATION NO. | : 14/461015 | |
| DATED | : September 1, 2015 | |
| INVENTOR(S) | : HongLiang Shen et al. | |

It is certified that error appears in the above-identified patent and that said Letters Patent is hereby corrected as shown below:

On the Title page, column 1, item (72), the 6th inventor's information which reads:

"Wanxum He, Mechanicville, NY (US)" should read:

"Wanxun He, Mechanicville, NY (US)"

Signed and Sealed this
Seventh Day of June, 2016

Michelle K. Lee
*Director of the United States Patent and Trademark Office*